United States Patent
Tsuruta (10) Patent No.: US 8,748,843 B2
(45) Date of Patent: Jun. 10, 2014

(54) CHARGED PARTICLE BEAM DRAWING APPARATUS AND CHARGED PARTICLE BEAM DRAWING METHOD

(75) Inventor: Kaoru Tsuruta, Yokohama (JP)

(73) Assignee: NuFlare Technology, Inc., Numazu-shi (JP)

( * ) Notice: Subject to any disclaimer, the term of this patent is extended or adjusted under 35 U.S.C. 154(b) by 0 days.

(21) Appl. No.: 13/568,657

(22) Filed: Aug. 7, 2012

(65) Prior Publication Data

US 2013/0037724 A1 Feb. 14, 2013

(30) Foreign Application Priority Data

Aug. 10, 2011 (JP) .................................. 2011-174620

(51) Int. Cl.
*H01J 37/304* (2006.01)

(52) U.S. Cl.
CPC ..... *H01J 37/3045* (2013.01); *H01J 2237/2826* (2013.01); *H01J 2237/30433* (2013.01); *H01J 2237/30438* (2013.01); *H01J 2237/30455* (2013.01); *H01J 37/304* (2013.01)
USPC ...... 250/397; 250/252.1; 250/310; 250/491.1

(58) Field of Classification Search
CPC ...................... H01J 37/3045; H01J 2237/2826; H01J 2237/3043; H01J 2237/3045
USPC .................... 250/491.1, 492.1, 492.2, 492.22
See application file for complete search history.

(56) References Cited

U.S. PATENT DOCUMENTS

| 5,209,813 | A  | * | 5/1993 | Oshida et al. .................... 216/59 |
| 5,528,047 | A  |   | 6/1996 | Nakajima |
| 5,969,365 | A  | * | 10/1999 | Takemoto et al. .......... 250/491.1 |
| 2002/0053634 | A1 | * | 5/2002 | Watanabe et al. .......... 250/201.2 |
| 2002/0179857 | A1 |   | 12/2002 | Higuchi |
| 2004/0211919 | A1 | * | 10/2004 | Tanaka et al. ............... 250/491.1 |
| 2006/0285112 | A1 | * | 12/2006 | Reich et al. .................... 356/400 |
| 2007/0023689 | A1 |   | 2/2007 | Iizuka et al. |
| 2007/0103659 | A1 | * | 5/2007 | Yoshitake et al. .............. 355/53 |
| 2007/0114449 | A1 | * | 5/2007 | Nakayama ................. 250/491.1 |
| 2010/0239256 | A1 | * | 9/2010 | Zheng .............................. 398/66 |
| 2011/0133066 | A1 | * | 6/2011 | Nozoe et al. ................ 250/252.1 |
| 2011/0253892 | A1 | * | 10/2011 | Yamaguchi ................... 250/307 |

* cited by examiner

*Primary Examiner* — Nicole Ippolito
*Assistant Examiner* — James Choi
(74) *Attorney, Agent, or Firm* — Oblon, Spivak, McClelland, Maier & Neustadt, L.L.P.

(57) ABSTRACT

A charged particle beam drawing apparatus of an embodiment includes: a drawing unit to perform drawing on a workpiece on a stage by using a charged particle beam; multiple marks located on the stage and having different heights; an irradiation position detector to, when any of the marks is irradiated with the charged particle beam, detect an irradiation position of the charged particle beam on a mark surface of the mark; a drift-amount calculation unit to calculate a drift amount of the charged particle beam on the mark surface by using the irradiation position; a drift-amount processing unit to obtain a drift amount on a workpiece surface by using the drift amounts on at least two of the mark surfaces; and a drawing controller to correct an is irradiation position of the charged particle beam by using the drift amount on the workpiece surface.

15 Claims, 5 Drawing Sheets

CHARGED PARTICLE BEAM DRAWING APPARATUS AND CHARGED PARTICLE BEAM DRAWING METHOD

CROSS-REFERENCE TO THE RELATED APPLICATION

This application is based on and claims the benefit of priority from Japanese Patent Application No. 2011-174620, filed on Aug. 10, 2011; the entire contents of which are incorporated herein by reference.

FIELD

Embodiments relate to a charged particle beam drawing apparatus and a charged particle beam drawing method.

BACKGROUND

With the advancement of integration and capacity increase of a large scale integrated circuit (LSI) in recent years, a semiconductor device has been increasingly required to have a smaller width of a circuit line. In the semiconductor device, a desired circuit pattern is formed by a lithography technique, which employs a pattern transfer using an original pattern called a mask (a reticle). A highly accurate mask for use in the pattern transfer is manufactured by using a charged particle beam drawing apparatus having excellent resolutions.

As an example of the charged particle beam drawing apparatus, a charged particle beam drawing apparatus configured to draw a pattern in the following manner has been developed. Specifically, the pattern to be drawn on a workpiece such as a mask or a mask blank is divided into multiple stripe regions, and each stripe region is divided into a large number of sub-regions. While a stage having the workpiece placed thereon is being moved in a longitudinal direction of the stripe region, an electron beam is positioned in one of the sub-regions by using main deflection and is shot at predetermined positions by using sub-deflection.

In such a charged particle beam drawing apparatus, a phenomenon called beam drift may occur in which an irradiation position of the electron beam during the drawing is shifted over time due to various factors. One of the factors of the beam drift is generation of an electric field due to reflected electrons. Specifically, reflected electrons are generated due to irradiation of the workpiece with the electron beam, charge-up occurs due to collision of the generated reflected electrons with an optical system, a detector or the like in the apparatus, and thereby a new electric field is generated. The electric field changes an orbit of the electron beam, and thus the beam drift occurs.

In order to cancel out the beam drift, a drift correction is performed. In the drift correction, a drift amount of the electron beam is measured, and a shot position of the electron beam, that is, the irradiation position is corrected so that the drift amount can be cancelled out. In this correction, a mark for position measurement provided on the stage is regularly scanned by the electron beam in order to measure the drift amount. The mark is a mark member having a predetermined height and is fixed on the stage.

Meanwhile, workpieces generally have a tolerance and thus have thicknesses different from each other. For this reason, the height of a workpiece surface on the stage varies depending on the workpiece. Such variation in the height of the workpiece surface causes a shift of the irradiation position of the electron beam. Hence, in order to correct the irradiation position according to the height of a workpiece, some of the charged particle beam drawing apparatuses are proposed each including, for example, a height measurement device configured to measure the height of the workpiece by use of laser light made incident on and reflected from the workpiece surface on the stage, a calibration block configured to calibrate the height measurement device, and the like.

However, the thickness of the workpiece depends on the workpiece. When the drift correction is performed by using the mark as described above, it is difficult to make the workpiece surface and the mark surface flush with each other, and thus the workpiece surface and the mark surface are different in height in a current situation. For this reason, when the electron beam is made incident obliquely on the workpiece and the mark surface, an error occurs between a drift amount on the mark surface and a real drift amount on the workpiece surface. However, the drift amount on the mark surface is used for the drift correction without any adjustment. This leads to a drift correction inadequate due to the aforementioned error, and the inadequate drift correction causes a shift of the irradiation position of the electron beam and therefore lowers the pattern drawing accuracy.

In particular, when the aforementioned electric field generated due to the charge-up caused by the reflected electrons abruptly disappears, an angle of incidence of the electron beam is abruptly and largely changed. The larger the angle of incidence of the electron beam, the more considerable the error between the drift amount on the mark surface and the real drift amount on the workpiece surface. This also leads to the inadequate drift correction as in the case described above, and the inadequate drift correction causes a shift of the irradiation position of the electron beam and therefore lowers the pattern drawing accuracy.

DETAILED DESCRIPTION

According to one embodiment of the present invention, a charged particle beam drawing apparatus includes: a drawing unit configured to perform drawing on a workpiece on a stage by using a charged particle beam; multiple marks which are located on the stage and have heights different from each other; an irradiation position detector configured to, when any of the marks is irradiated with the charged particle beam, detect an irradiation position of the charged particle beam on a mark surface of the mark; a drift-amount calculation unit configured to calculate a drift amount of the charged particle beam on the mark surface by using the irradiation position detected by the irradiation position detector; a drift-amount processing unit configured to obtain a drift amount on a workpiece surface by using the drift amounts on at least two of the mark surfaces calculated by the drift-amount calculation unit; and a drawing controller configured to correct an irradiation position of the charged particle beam by using the drift amount on the workpiece surface obtained by the drift-amount processing unit.

According to another embodiment, a charged particle beam drawing method is for performing drawing with a charged particle beam drawing apparatus including a drawing unit and multiple marks, the drawing unit being configured to perform the drawing on a workpiece on a stage by using a charged particle beam, the multiple marks being located on the stage and having heights different from each other. The method includes: when any of the marks is irradiated with the charged particle beam, detecting an irradiation position of the charged particle beam on a mark surface of the mark; calculating a drift amount of the charged particle beam on the mark surface by using the detected irradiation position; obtaining a drift amount on a workpiece surface by using the calculated drift amounts on at least two of the mark surfaces; and correcting an irradiation position of the charged particle beam by using the obtained drift amount on the workpiece surface.

Hereinbelow, one embodiment of the present invention will be described with reference to the drawings.

Figure 1:
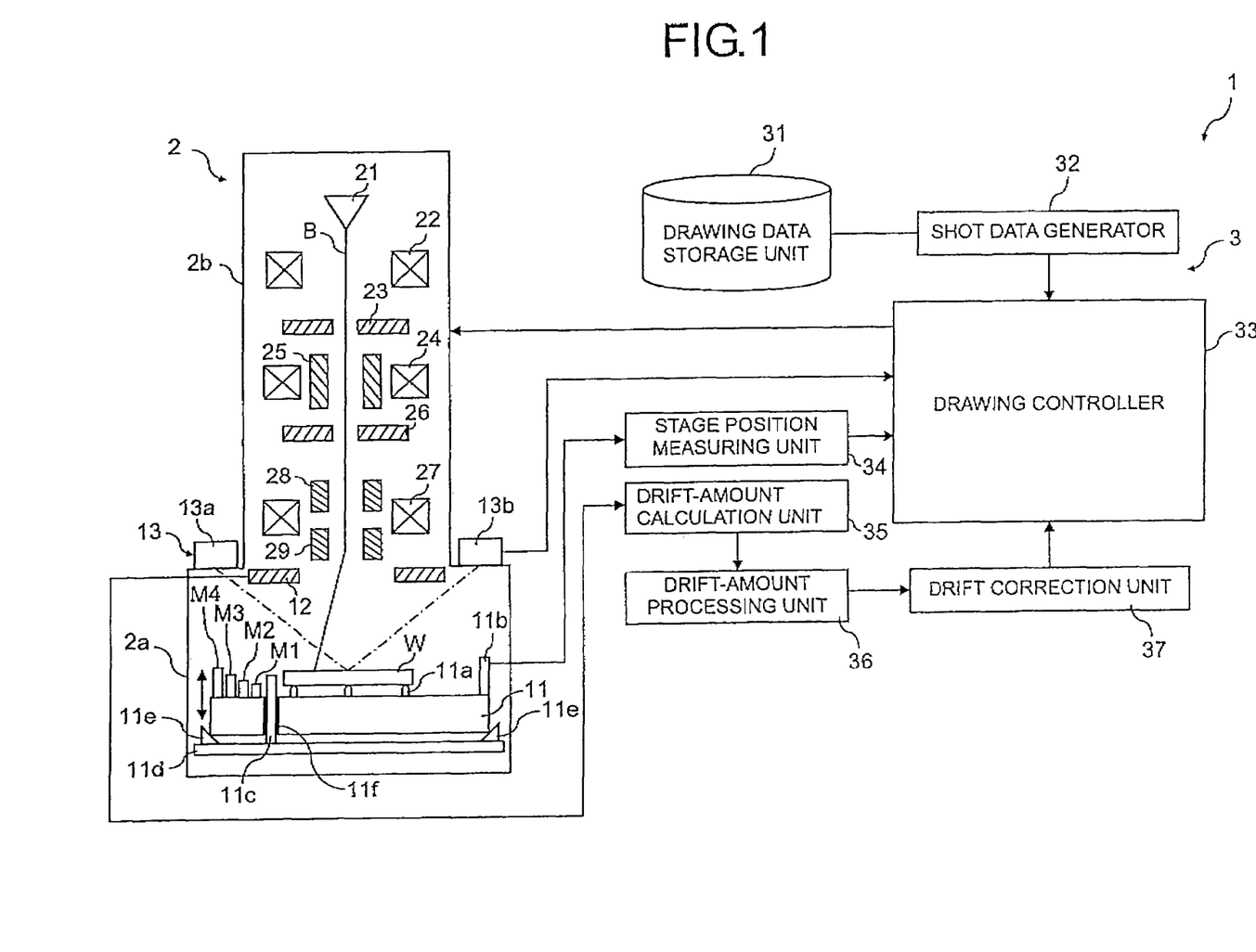
FIG. 1 is a diagram showing a schematic configuration of a charged particle beam drawing apparatus according to one embodiment of the present invention.

As shown in FIG. 1, a charged particle beam drawing apparatus 1 according to the embodiment includes: a drawing unit 2 configured to perform drawing by a charged particle beam; and a controller 3 configured to control the drawing unit 2. The charged particle beam drawing apparatus 1 is taken as an example of a variable-shape drawing apparatus using an electron beam as the charged particle beam. Note that the charged particle beam is not limited to the electron beam, and may be another charged particle beam such as an ion beam.

The drawing unit 2 includes: a drawing chamber 2a accommodating a workpiece W which is a drawing target; and an optical lens barrel 2b communicating with the drawing chamber 2a. The optical lens barrel 2b is provided on an upper surface of the drawing chamber 2a. The optical lens barrel 2b emits an electron beam B onto the workpiece W in the drawing chamber 2a, while shaping and deflecting the electron beam B.

A stage 11 including multiple support pins 11a supporting the workpiece W such as a mask or a mask blank is provided in the drawing chamber 2a. The support pins 11a are provided, for example, in three to support the workpiece W at three positions. The stage 11 is formed to be movable in an X direction and in a Y direction which are orthogonal to each other on a horizontal plane and is moved by a stage moving mechanism which is not shown in FIG. 1. Further, the stage 11 is formed to be movable also in a Z direction orthogonal to the X and Y directions.

Figure 2:
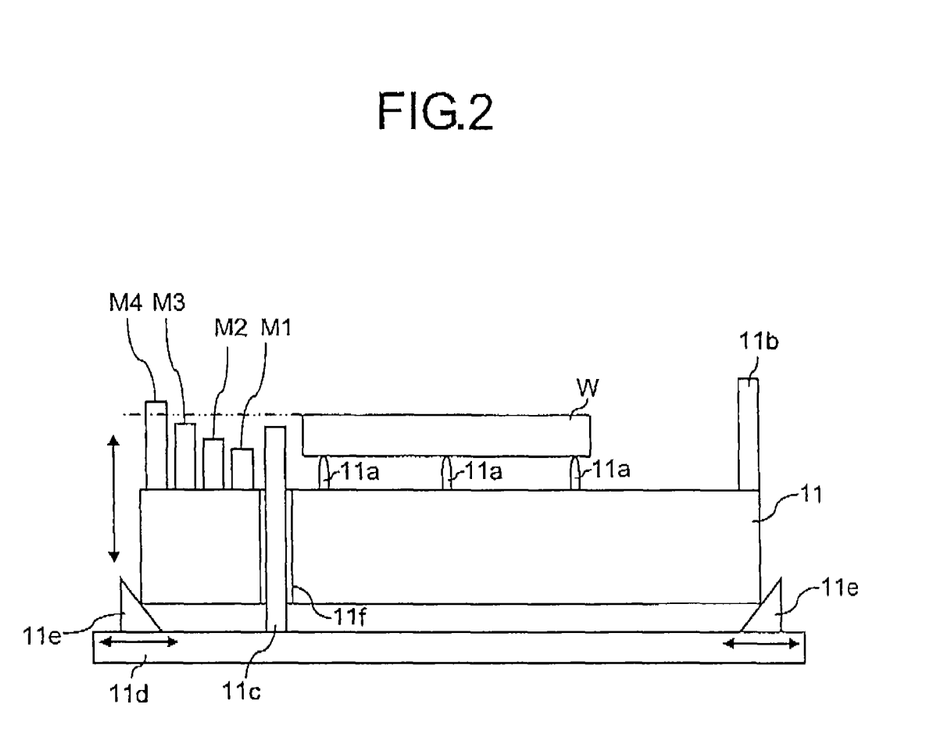
FIG. 2 is a diagram showing a schematic configuration of a stage of the charged particle beam drawing apparatus shown in FIG. 1.

As shown in FIGS. 1 and 2, a mirror 11b for measuring a position of the stage 11 on the horizontal plane and marks M1, M2, M3, and M4 for measuring drift amounts of the electron beam B, respectively, are provided on a surface of the stage 11. The mirror 11b is fixed on an end portion of the surface of the stage 11, and likewise the marks M1 to M4 are also fixed in line on an end portion of the surface of the stage 11. The marks M1 to M4 are mark members having mutually different predetermined heights. For example, a height difference between each two adjacent ones of the marks M1 to M4 is 50 μm. Note that a figure such as a cross or a grid made of a material having a reflectance different from those of other portions is formed on surfaces (upper surfaces) of the marks M1 to M4.

A pedestal 11d having a reference height member 11c serving as a height reference for a surface of the workpiece W (a workpiece surface) is provided below the stage 11. The reference height member 11c is fixed on the pedestal 11d, for example, to be located in a cut out portion 11f of the stage 11 when the stage 11 is in a standby state, so that the stage 11 cannot be prevented from moving. The focus of the electron beam B is made flush with a surface of the reference height member 11c, the surface thereof and the surface of the workpiece W are made flush with each other, and the electron beam B is focused on the surface of the workpiece W. Here, the cut out portion 11f is formed into a groove extending in an extending direction of the reference height member 11c in a side surface of the stage 11. The reference height member 11c enters the cut out portion 11f due to movement of the stage 11 in a predetermined direction (for example, the Y direction) on the horizontal plane.

In addition, multiple wedge members 11e for moving the stage 11 in the Z direction are provided between the stage 11 and the pedestal 11d. The wedge members 11e are provided in such a manner as to be inserted from both ends of the stage 11 into a space between the stage 11 and the pedestal 11d. A stage lifting mechanism having the wedge members lie moves the wedge members 11e located between the stage 11 and the pedestal 11d in a direction of inserting or withdrawing the wedge members lie, so that the stage 11 is moved in the Z direction.

Referring back to FIG. 1, an irradiation position detector 12 is provided in the drawing chamber 2a, The electron beam B is emitted onto the marks M1 to M4, and thereby the irradiation position detector 12 detects irradiation positions of the electron beam B on the marks M1 to M4 on the stage 11. The irradiation position detector 12 is an electron detector configured to detect, as current values, electrons reflected on the marks M1 to M4 while the electron beam B is scanning the marks M1 to M4. However, the irradiation position detector 12 is not limited to this, and may detect, for example, secondary electrons as current values, instead of the reflected electrons.

In addition, a surface height detector 13 configured to detect a surface height of the workpiece W on the stage 11 is provided on an outer peripheral surface of the drawing chamber 2a. The surface height detector 13 includes a phototransmitter 13a configured to emit laser light obliquely downward onto the surface of the workpiece W on the stage 11 and a photoreceiver 13b configured to receive light reflected on the surface of the workpiece W. The surface height detector 13 emits the laser light from the phototransmitter 13a, receives the light reflected on the surface of the workpiece W on the stage 11 by using the photoreceiver 13b, and detects the surface height of the workpiece W on the stage 11 based on the position at which the reflected light is received.

In the optical lens barrel 2b, there are arranged an electron gun 21 configured to emit the electron beam B, an illuminating lens 22 configured to concentrate the electron beam B, a first shaping aperture 23 for beam shaping, a projection lens 24 for projection, a shaping deflector 25 for beam shaping, a second shaping aperture 26 for beam shaping, an objective lens 27 for focusing the electron beam B on the workpiece W, and a sub-deflector 28 and a main deflector 29 for controlling a shot position (a beam irradiation position) of the electron beam B on the workpiece W.

In such a drawing unit 2, the electron beam B is emitted from the electron gun 21 onto the first shaping aperture 23 through the illuminating lens 22. The first shaping aperture 23 has an opening in a square, for example. Thereby, after passing through the first shaping aperture 23, a cross section of the electron beam B is shaped into a square. The cross section is projected onto the second shaping aperture 26 through the projection lens 24. Note that a position of the projection position can be deflected by the shaping deflector 25, and the shape and the dimensions of the electron beam B can be controlled by changing the projection position. Thereafter, the electron beam B passing through the second shaping aperture 26 is focused onto the workpiece W on the stage 11 through the objective lens 27. Note that the shot position of the electron beam B on the workpiece W on the stage 11 can be controlled by using the sub-deflector 28 and the main deflector 29.

The controller 3 includes: a drawing data storage unit 31 configured to store drawing data; a shot data generator configured to generate shot data by processing the drawing data; a drawing controller 33 configured to control the drawing unit 2; a stage position measuring unit 34 configured to measure the position of the stage 11 on the horizontal plane; a drift-amount calculation unit 35 configured to calculate drift amounts on the surfaces of the marks M1 to M4; a drift-amount processing unit 36 configured to obtain a drift amount on the workpiece surface, that is, a real drift amount, by using the drift amounts on the mark surfaces; a drift correction unit 37 configured to correct a drift of the electron beam B on the workpiece W by using the real drift amount. Here, the aforementioned units may be implemented by hardware such as electronic circuits, by software such as programs for executing the functions of the units or by a combination of both.

The drawing data storage unit 31 is a storage unit for storing drawing data for drawing a pattern on the workpiece W. The drawing data is data obtained by converting design data (layout data) created by a semiconductor integrated circuit designer or the like into data which can be inputted in the charged particle beam drawing apparatus 1, that is, into a format for the charged particle beam drawing apparatus 1. The data is inputted from an external device to the drawing data storage unit 31 to, be stored therein, As the drawing data storage unit 31, a magnetic disk device or a semiconductor disk device (a flash memory), for example, can be used.

Meanwhile, the aforementioned design data generally include a large number of fine patterns and thus have a considerably large data volume. If the design data is converted into another format without any special processing, the design data will have a further increased data volume after the conversion. For this reason, data volume compression is achieved in the drawing data by such a method as data layering or pattern array displaying. The data as described above is used for specifying such a pattern in a chip area or in a virtual chip area assumed to be a single chip by virtually merging chip areas given the same drawing condition.

The shot data generator 32 divides, for example, a pattern specified by the drawing data into multiple stripe regions each having a stripe shape (a strip shape), and further divides each stripe region into a large number of sub-regions in a matrix form. In addition, the shot data generator 32 determines the shapes, the sizes, the positions of figures in each sub-region. Further, if the figures cannot be drawn at one shot, the shot data generator 32 divides the sub-region into multiple part areas that can be drawn in one shot and then generates shot data. Note that the length in a short-side direction (the Y direction) of each stripe region is set so that main deflection of the electron beam B can be performed.

The pattern is drawn in the following manner. While moving the stage 11 in the X direction which is a longitudinal direction of the stripe region, the drawing controller 33 positions the electron beam B in one of the sub-regions by using the main deflector 29 and then shoots the electron beam B in the sub-region at predetermined positions by using the sub-deflector 28. Upon completion of the drawing on one stripe region, the stage 11 is moved in the Y direction by one step, and then the drawing is performed on the next stripe region. This is repeated until the drawing using the electron beam B is performed on all the drawing regions of the workpiece W. Note that since the stage 11 is continuously moved in one direction during the drawing, the main deflector 29 causes the electron beam B on the sub-region to track the drawing start point so that the drawing start point can follow the movement of the stage 11.

As described above, the electron beam B is deflected by the sub-deflector 28 and the main deflector 29. While the electron beam B is following the continuously moving stage 11, the shot position of the electron beam B (the beam irradiation position) is positioned. While the stage 11 is continuously moved in the X direction, the shot position of the electron beam B follows the stage 11, whereby a time required for the drawing can be reduced. Although the stage is continuously moved in the X direction in the embodiment of the present invention, the way of moving is not limited thereto. For example, a step and repeat method may be used in which the drawing is performed on one sub-region while the stage 11 is stopped, and the drawing is not performed while the electron beam B is moving to the next sub-region. In addition, although the multi-step deflectors based on the two main and sub deflections are used in this embodiment, a deflector is not limited thereto. A deflector based on one deflection may be used.

The stage position measuring unit 34 includes a laser length measuring machine configured to measure the position of the stage 11 by making the laser light incident and reflect on the mirror 11b fixed on the stage 11. The stage position measuring unit 34 transmits the measured position of the stage 11 on the horizontal plane to the drawing controller 33. Here, the means for measuring the position of the stage 11 is not particularly limited. As far as the means is capable of measuring the position of the stage 11, any means may be used.

By using the irradiation positions of the electron beam B on the marks M1 to M4 which are detected by the irradiation position detector 12 by scanning the marks M1 to M4, the drift-amount calculation unit 35 calculates amounts of shifting of the irradiation positions from reference positions of the irradiation positions (reference positions of the marks M1 to M4) as drift amounts of the electron beam B. Then, the drift-amount calculation unit 35 transmits the calculated drift amounts, that is, the drift amounts on the mark surfaces to the drawing controller 33. The drawing controller 33 stores the drift amounts on the mark surfaces as necessary. Here, in calculating the drift amounts, the reference positions of the marks M1 to M4 are placed corresponding to the center position of the objective lens 27 by moving the stage 11.

The drift-amount processing unit 36 obtains the real drift amount on the workpiece surface on the stage 11 by using the drift amounts on at least two mark surfaces calculated by the drift-amount calculation unit 35, and transmits the obtained drift amount to the drift correction unit 37 (details will be described later). At this time, the drift amounts on all of the marks M1 to M4 may be used, but the drift amounts of at least two of the marks M1 to M4 need to be used to obtain the real drift amount.

The drift correction unit 37 calculates a drift correction amount based on the real drift amount received from the drift-amount processing unit 36, corrects a deflection amount of the electron beam B, that is, the beam irradiation position based on the calculated drift correction amount, and transmits correction information thereof to the drawing controller 33.

The drawing controller 33 performs the drawing based on not only the aforementioned drawing data but also the correction information.

Next, a description is given of drawing processing (a drawing operation) performed by the aforementioned charged particle beam drawing apparatus 1. The drawing processing includes drift measurement processing and drift correction processing and is executed by the controller 3.

Note that since it takes time to stabilize the drawing, that is, beam emission by cancelling out the beam drift, the drift correction needs to be frequently performed in a period from the start of beam emission until the stabilization thereof. For this reason, the drift correction is performed at a short interval immediately after the emission start, but the interval gradually becomes longer with the elapse of time. A drift amount measurement instruction for measuring drift amounts is repeatedly issued on the basis of such a correction interval.

Figure 3:
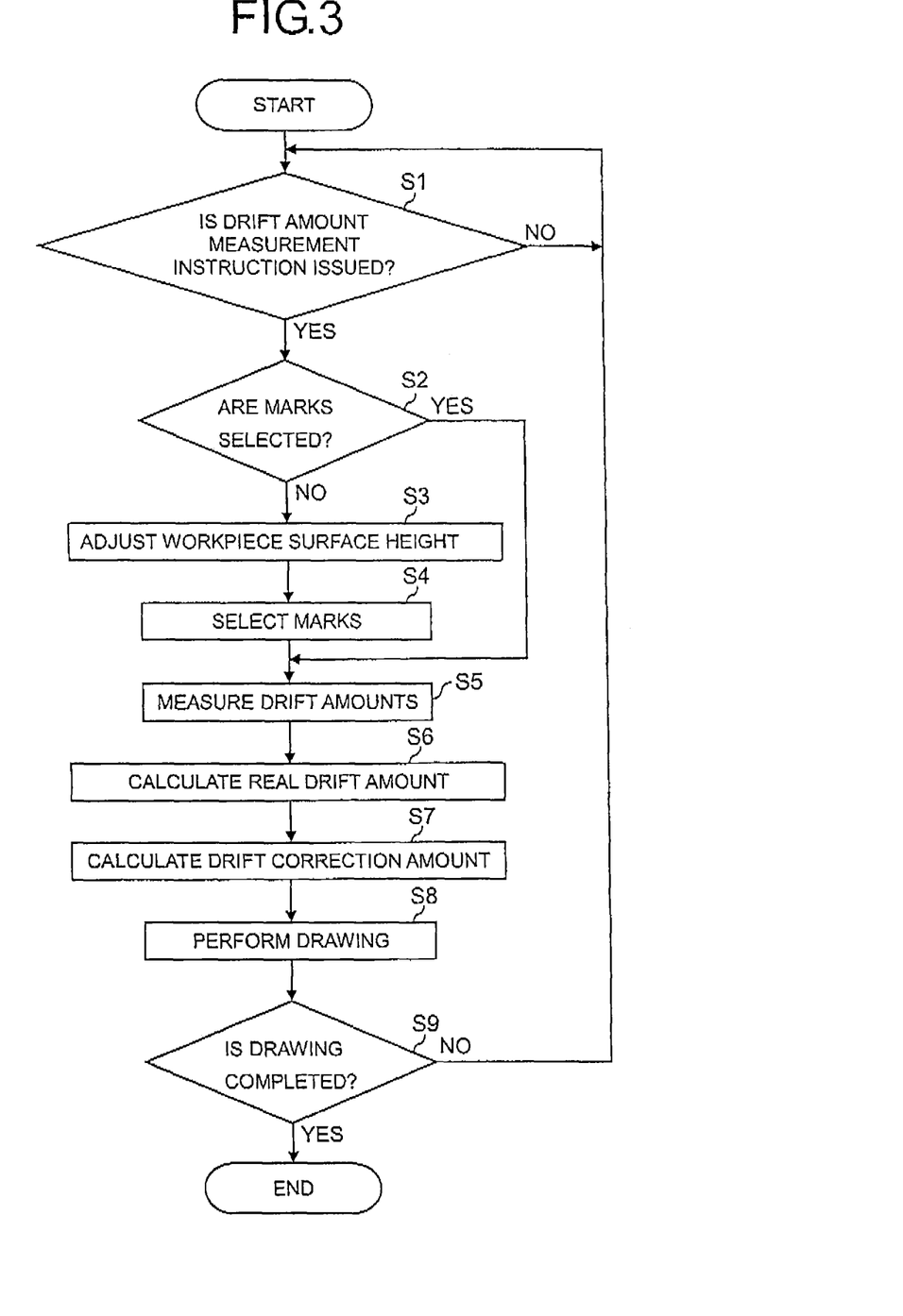
FIG. 3 is a flowchart showing a flow of drawing processing performed by the charged particle beam drawing apparatus shown in FIG. 1.

As shown in FIG. 3, firstly, it is judged whether or not a drift amount measurement instruction is issued (Step S1). If it is judged a drift amount measurement instruction is not issued (NO in Step S1), the judgment is repeated. If it is judged that the drift amount measurement instruction is issued (YES in Step S1), it is judged whether or not marks to be used for drift amount measurement have been selected (Step S2).

If it is judged in Step S2 that the marks to be used for drift amount measurement have been selected (YES in Step S2), the processing proceeds to Step S5. On the other hand, if it is judged that marks to be used for drift amount measurement have not been selected (NO in Step S2), the height of the surface of the workpiece W (the workpiece surface) is adjusted (Step S3).

Figure 4:
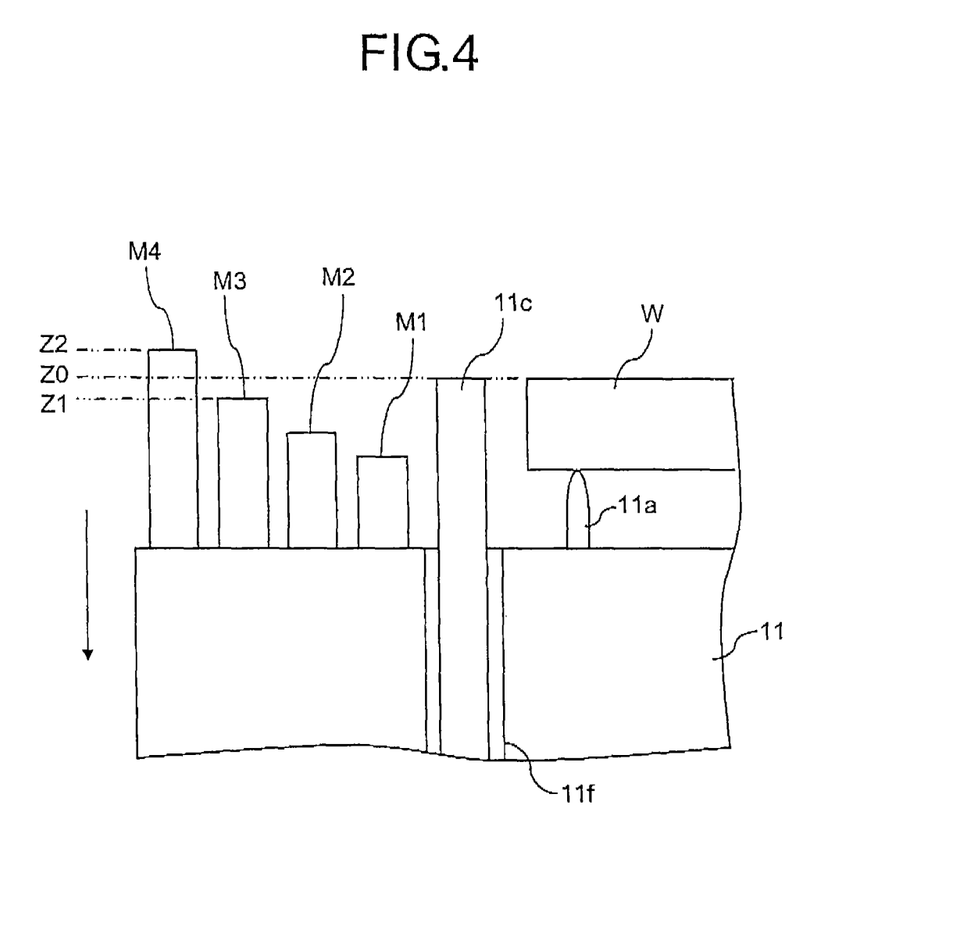
FIG. 4 is an explanatory diagram for explaining height adjustment of a workpiece surface and mark selection in the drawing processing shown in FIG. 3.

In the height adjustment of the surface of the workpiece W, the height of the surface of the workpiece W is detected by the surface height detector 13, and is inputted in the drawing controller 33. As shown in FIG. 4, the stage lifting mechanism moves the stage 11 downward based on the inputted height of the surface of the workpiece W to eliminate a difference in height between the surface (an upper surface) of the workpiece W and the surface (an upper surface) of the reference height member 11c. This makes the surface of the workpiece w and the surface of the reference height member 11c flush with each other. Here, the height of the surface of the workpiece W may be set, for example, at an average of surface heights detected at several points on the workpiece W.

Referring back to FIG. 3, upon completion of Step S3 described above, marks to be used for the drift amount measurement are selected (Step S4). In the mark selection, as shown in FIG. 4, in the aforementioned state where the surface of the workpiece W and the surface of the reference height member 11c are flush with each other, the two marks M3 and M4 are selected whose heights are close to the height of the surface of the workpiece W. At this time, a height Z0 of the workpiece surface falls within a range between heights Z1 and Z2 of the respective two marks M3 and M4 (Z1☐Z0☐Z2). Note that the surface height of the workpiece W on the stage 11 is known in Step S3 described above, and height information on the heights of the marks M1 to M4 is in advance stored in a storage, unit (not shown). The height information of the marks M1 to M4 indicates the height thereof from the surface of the stage 11. The information is used (a reference position for the information is the position of the surface of the stage 11) to select the two marks M3 and M4 whose heights are close to the height of the surface of the workpiece W.

Referring back to FIG. 3, upon completion of Step S4 described above, the selected two marks M3 and M4 are used to measure the drift amounts (Step S5). In the drift amount measurement, the reference position of the mark M3 is firstly placed corresponding to the center position of the objective lens 27 by moving the stage 11, and the mark M3 is scanned at the position by using the electron beam B. Reflected electrons at this time are detected as a current value by the irradiation position detector 12 to obtain a irradiation position of the electron beam B, and an amount of shifting of the irradiation position from the reference position (the reference position of the mark M3) is calculated as a drift amount of the electron beam B on the surface of the mark M3. Next, the reference position of the mark M4 is placed corresponding to the center position of the objective lens 27 by moving the stage 11, and the mark M4 is scanned at the position by using the electron beam B. Then, a drift amount of the electron beam B on the surface of the mark M4 is calculated in the same manner as described above.

Upon completion of Step S5, a real drift amount on the surface of the workpiece W on the stage 11 is obtained (Step S6). In the calculation of the real drift amount, the drift-amount processing unit 36 uses the drift amount on the mark M3 (a first mark) and the drift amount on the mark M4 (a second mark) to calculate the real drift amount on the surface of the workpiece W on the stage 11 in the following manner.

Figure 5:
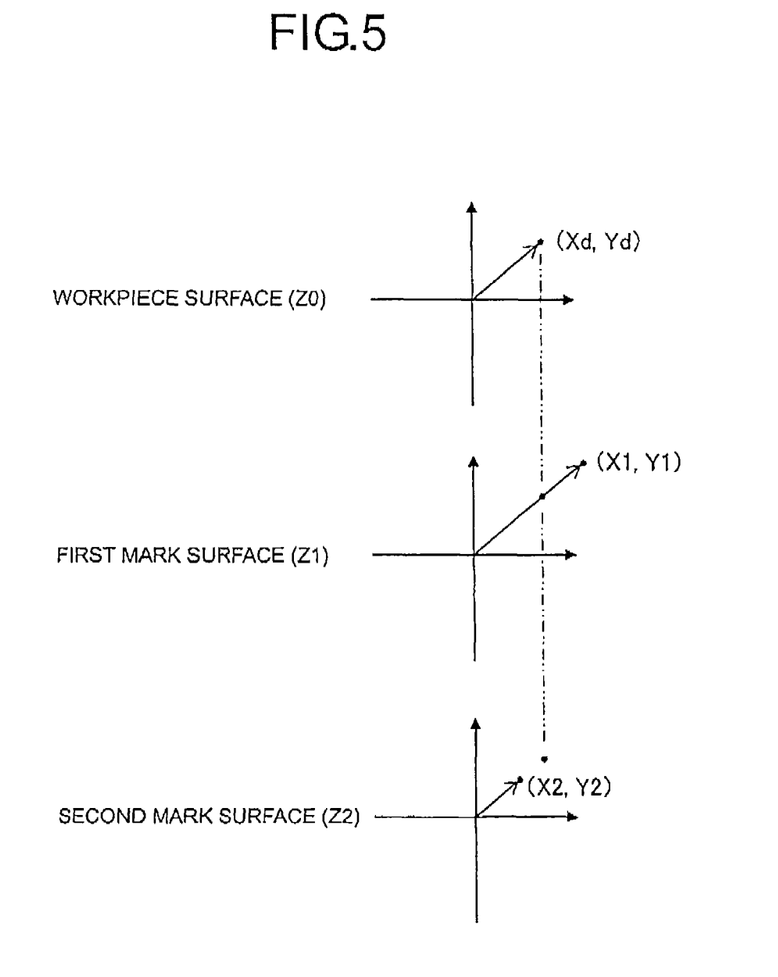
FIG. 5 is explanatory diagram for explaining calculation of a real drift amount on the workpiece surface in the drawing processing shown in FIG. 3.

Herein, as shown in FIG. 5, the drift amount on the workpiece surface which is the real drift amount is (Xd, Yd), the height of the workpiece surface is Z0, the drift amount on the surface of the first mark is (X1, Y2), the height of the surface of the first mark is Z1, the drift amount on the surface of the second mark is (X2, Y2), and the height of the surface of the second mark is Z2 (see FIG. 4). Note that the electron beam B is made incident on the workpiece surface and the mark surfaces at the same angle, but the drift amounts thereon are different from each other due to the height differences.

Firstly, a general formula for a drift amount on a surface of a mark is obtained where a drift amount of the mark is (Xn, Yn) and the height of the mark surface is Zn. In this case, the following equations hold true.

$$Xn=Xd+Ax(Zn-Z0)$$

$$Yn=Yd+Ay(Zn-Z0)$$

Here, n is a natural number, and Ax and Ay are factors of proportionality.

When n=1 and n=2 are substituted in Xn=Xd+Ax (Zn−Z0) which is the aforementioned equation related to an X coordinate, the following equations are obtained.

$$X1=Xd+Ax(Z1-Z0)$$

$$X2=Xd+Ax(Z2-Z0)$$

These equations lead to the following equation.

$$Ax=(X2-X1)/(Z2-Z1)$$

When this equation is substituted in X1=Xd+Ax (Z1−Z0), the following equation is obtained.

$$X1=Xd+(X2-X1)/(Z2-Z1)\times(Z1-Z0)$$

When this equation is transformed, the following equation is obtained.

$$Xd=X1-(X2-X1)/(Z2-Z1)\times(Z1-Z0)$$

Next, n=1 and n=2 are substituted in Yn=Yd+Ay(Zn−Z0) which is the aforementioned equation related to a Y coordinate, and calculations are performed in the same manner as the above. Then, the following equation is obtained.

$$Yd=Y1-(Y2-Y1)/(Z2-Z1)\times(Z1-Z0)$$

Here, the height Z0 of the workpiece surface is equal to the height of the reference height member 11c, and is the reference height of 0 (zero).

In this manner, the drift amount (Xd, Yd) on the workpiece surface which is the real drift amount is calculated from the first drift amount (X1, Y1) on the first mark surface and the second drift amount (X2, Y2) on the second mark surface.

Referring back to FIG. 3, upon completion of Step S6 described above, a drift correction amount is calculated by using the calculated real drift amount (Step S7). In the calculation of the drift correction amount, the drift correction unit 37 uses the real drift amount to calculate the drift correction amount for cancelling out the real drift amount (for example, when the real drift amount is +1 μm, −1 μm is calculated as the drift correction amount). Based on the calculated drift correction amount, the drift correction unit 37 corrects a deflection amount of the electron beam B, that is, the beam irradiation position, so that correction information thereof is obtained.

After the calculation of the drift correction amount, drawing data is read from the drawing data storage unit 31, and the drawing is performed based on the read drawing data and further the aforementioned correction information (Step S8). Thereafter, it is judged whether or not the drawing is completed (Step S9). If it is judged that the drawing is not completed (NO in Step S9), the processing returns to Step S1 to repeat the aforementioned processing. On the other hand, if it is judged that the drawing is completed (YES in Step S9), the processing is terminated.

As described above, according to the embodiment described above, the drift amounts on at least two mark surfaces are used to obtain the real drift amount on the surface of the workpiece w on the stage 11. The two marks M3 and M4 different in height are used to obtain the real drift amount on the workpiece surface from the drift amounts as described above. Thus, it is possible to eliminate the error between each drift amount on the corresponding mark surface and the real drift amount on the workpiece surface. This makes it possible to prevent the shifting of the beam irradiation position depending on the height difference between the workpiece surface and the mark surface and thus to enhance the pattern drawing accuracy. In particular, even in a case where the angle of incidence of the electron beam B is abruptly and largely changed due to the disappearance of the electric field generated by the charge-up caused by reflected electrons, it is possible to reliably eliminate the error between the drift amount on the mark surface and the real drift amount on the workpiece surface.

Moreover, the mark M3 lower than the surface of the workpiece W and the mark M4 higher than the surface of the workpiece W are selected from the multiple marks M1 to M4, and the real drift amount is obtained by using the drift amounts of the selected marks M3 and M4. Thereby, the height of the surface of the workpiece W is included in the range between the heights of the surfaces of the marks M3 and M4, and thus the real drift amount can be obtained more accurately. Further, the real drift amount can be obtained by using only the two marks M3 and M4, and thus the processing time required for calculating the real drift amount can be reduced in comparison with a case of using three or more marks. In addition, what is required is to measure the drift amounts of only the two marks M3 and M4, and thus the drift measuring time can be reduced.

Note that the real drift amount is obtained by using the drift amounts of the two marks M3 and M4 in the aforementioned embodiment, but the way of obtaining the real drift amount is not limited thereto. For example, the real drift amount may be obtained by processing drift amounts of three or more marks by using a quadratic function. In this case, since a larger number of drift amount values are used to calculate the real drift amount, the real drift amount can be obtained more accurately.

Besides, although the four marks M1 to M4 are provided as the marks in the aforementioned embodiment, the number of the marks is not limited thereto. For example, only two marks may be provided. Also in this case, the same advantageous effects as described above can be obtained. However, it is preferable to provide two marks one of which is lower than the surface of the workpiece W and the other one of which is higher than the surface of the workpiece W. In a case of a relatively small thickness tolerance of the workpiece W, it is possible to provide such two marks that have a height range including the height of the surface of the workpiece W.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A charged particle beam drawing apparatus comprising:
a drawing unit configured to perform drawing on a workpiece on a stage by using a charged particle beam;
a plurality of marks which are located on the stage and have heights different from each other;
an irradiation position detector configured to, when any of the marks is irradiated with the charged particle beam, detect an irradiation position of the charged particle beam on a mark surface of the mark;
a drift-amount calculation unit configured to calculate a drift amount of the charged particle beam on the mark surface by using the irradiation position detected by the irradiation position detector;
a drift-amount processing unit configured to obtain a drift amount on a workpiece surface by using the drift amounts on at least two of the mark surfaces calculated by the drift-amount calculation unit;
a drawing controller configured to correct an irradiation position of the charged particle beam by using the drift amount on the workpiece surface obtained by the drift-amount processing unit;
a reference height member serving as a height reference for the workpiece surface and provided for focusing the charged particle beam on the workpiece surface; and
a stage lifting mechanism configured to lift and lower the stage, wherein
when the reference height member and the workpiece surface are made flush with each other by lifting or lowering the stage by the stage lifting mechanism, the drift-amount processing unit selects, from the plurality of marks, a mark having the height lower than a height of the workpiece surface and a mark having the height higher than the height of the workpiece surface, and obtains the drift amount on the workpiece surface by using the drift amounts on mark surfaces of the two selected marks.

2. The charged particle beam drawing apparatus according to claim 1, wherein when the reference height member and the workpiece surface are made flush with each other by lifting or lowering the stage by the stage lifting mechanism, the drift-amount processing unit selects, from the plurality of marks, the mark having the height lower than and closest to that of the workpiece surface and the mark having the height higher than and closest to that of the workpiece surface, and obtains the drift amount on the workpiece surface by using the drift amounts on the mark surfaces of the two selected marks.

3. The charged particle beam drawing apparatus according to claim 1, wherein
when the reference height member and the workpiece surface are made flush with each other by lifting or lowering the stage by the stage lifting mechanism, the drift-amount processing unit selects one or more of marks from the plurality of marks in addition to the two selected marks and processes the drift amounts on the mark surfaces of the three or more selected marks by using a quadratic function to obtain the drift amount on the workpiece surface.

4. The charged particle beam drawing apparatus according to claim 1, wherein
the drawing unit performs the drawing with the charged particle beam by emitting the charged particle beam onto the workpiece on the stage while deflecting the charged particle beam, and
the drawing controller corrects a deflection amount of the charged particle beam by using the drift amount on the workpiece surface obtained by the drift-amount processing unit.

5. The charged particle beam drawing apparatus according to claim 1, wherein
the irradiation position detector detects the irradiation position of the charged particle beam on one of the mark surfaces having a reference position of the mark which is flush with a focus of the charged particle beam on the workpiece surface, and
the drift-amount calculation unit calculates, as the drift amount on the mark surface, a shifting amount between the irradiation position detected by the irradiation position detector and the reference position of the mark.

6. The charged particle beam drawing apparatus according to claim 1, wherein the drawing controller repeats, at a certain interval, a series of operations including detecting the irradiation position of the charged particle beam on the mark surface by the irradiation position detector, calculating the drift amount on the mark surface by the drift-amount calculation unit, obtaining the drift amount on the workpiece surface by the drift-amount processing unit, and correcting the irradiation position of the charged particle beam by the drawing controller.

7. The charged particle beam drawing apparatus according to claim 6, wherein the drawing controller sets the certain interval to be longer as time passes after the drawing unit starts the irradiation of the charged particle beam.

8. A charged particle beam drawing method for performing drawing with a charged particle beam drawing apparatus including a drawing unit and a plurality of marks, the drawing unit being configured to perform the drawing on a workpiece on a stage by using a charged particle beam, the plurality of marks being located on the stage and having heights different from each other, the method comprising:
when any of the marks is irradiated with the charged particle beam, detecting an irradiation position of the charged particle beam on a mark surface of the mark;
calculating a drift amount of the charged particle beam on the mark surface by using the detected irradiation position;
obtaining a drift amount on a workpiece surface by using the calculated drift amounts on at least two of the mark surfaces; and
correcting an irradiation position of the charged particle beam by using the obtained drift amount on the workpiece surface, wherein
the charged particle beam drawing apparatus further comprises
a reference height member serving as a height reference for the workpiece surface and provided for focusing the charged particle beam on the workpiece surface, and
a stage lifting mechanism configured to lift and lower the stage, and
in the obtaining of the drift amount on the workpiece surface, the reference height member and the workpiece surface are made flush with each other by lifting or lowering the stage by the stage lifting mechanism, a mark having the height lower than that of the workpiece surface and a mark having the height higher than that of the workpiece surface are selected from the plurality of marks, and the drift amount on the workpiece surface is obtained by using the drift amounts on the mark surfaces of the two selected marks.

9. A charged particle beam drawing method for performing drawing with a charged particle beam drawing apparatus including a drawing unit and a plurality of marks, the drawing unit being configured to perform the drawing on a workpiece on a stage by using a charged particle beam, the plurality of marks being located on the stage and having heights different from each other, the method comprising:
when any of the marks is irradiated with the charged particle beam, detecting an irradiation position of the charged particle beam on a mark surface of the mark;
calculating a drift amount of the charged particle beam on the mark surface by using the detected irradiation position;
obtaining a drift amount on a workpiece surface by using the calculated drift amounts on at least two of the mark surfaces; and
correcting an irradiation position of the charged particle beam by using the obtained drift amount on the workpiece surface, wherein
in the obtaining of the drift amount on the workpiece surface, a mark having the height higher than that of the workpiece surface and a mark having the height lower than that of the workpiece surface are selected from the plurality of marks, and the drift amount on the workpiece surface is obtained by using the drift amounts on the mark surfaces of the two selected marks.

10. The charged particle beam drawing method according to claim 8, wherein in the obtaining of the drift amount on the workpiece surface, the reference height member and the workpiece surface are made flush with each other by lifting or lowering the stage by the stage lifting mechanism, the mark having the height lower than and closest to that of the workpiece surface and the mark having the height higher than and closest to that of the workpiece surface are selected from the plurality of marks, and the drift amount on the workpiece surface is obtained by using the drift amounts on the mark surfaces of the two selected marks.

11. The charged particle beam drawing method according to claim 8, wherein in the obtaining of the drift amount on the workpiece surface, the reference height member and the workpiece surface are made flush with each other by lifting or lowering the stage by the stage lifting mechanism, one or more of marks are selected from the plurality of marks in addition to the two selected marks, and the drift amounts on the mark surfaces of the three or more selected marks are processed by using a quadratic function to obtain the drift amount on the workpiece surface.

12. The charged particle beam drawing method according to claim 8, wherein the drawing unit performs the drawing with the charged particle beam by emitting the charged particle beam onto the workpiece on the stage while deflecting the charged particle beam, and in the correcting of the irradiation position of the charged particle beam, a deflection amount of the charged particle beam is corrected by using the obtained drift amount on the workpiece surface.

13. The charged particle beam drawing method according to claim 8, wherein in the detecting of the irradiation position of the charged particle beam on the mark surface, the irradiation position of the charged particle beam is detected on one of the mark surfaces having a reference position of the mark which is flush with a focus of the charged particle beam on the workpiece surface, and in the obtaining of the drift amount on the mark surface, a shifting amount between the detected irradiation position of the mark and the reference position of the mark is calculated as the drift amount on the mark surface.

14. The charged particle beam drawing method according to claim 8, wherein a series of operations is repeated at a certain interval, the series of operations including the detecting of the irradiation positions of the charged particle beam on the mark surfaces, the calculating of the drift amounts on the mark surfaces, the obtaining of the drift amount on the workpiece surface, and the correcting of the irradiation position of the charged particle beam.

15. The charged particle beam drawing method according to claim 14, wherein in the repeating of the series of operations, the certain interval is set to be longer as time passes after the drawing unit starts the irradiation of the charged particle beam.

* * * * *